US008214163B2

(12) United States Patent
Hertz

(10) Patent No.: US 8,214,163 B2
(45) Date of Patent: Jul. 3, 2012

(54) ENVELOPE GENERATION ALGORITHM

(75) Inventor: Michael G Hertz, Washington Township, MI (US)

(73) Assignee: LeCroy Corporation, Chestnut Ridge, NY (US)

( * ) Notice: Subject to any disclaimer, the term of this patent is extended or adjusted under 35 U.S.C. 154(b) by 330 days.

(21) Appl. No.: 11/378,528

(22) Filed: Mar. 17, 2006

(65) Prior Publication Data

US 2007/0219734 A1    Sep. 20, 2007

(51) Int. Cl.
*G01R 15/00* (2006.01)
*G01R 13/00* (2006.01)
(52) U.S. Cl. ............... 702/57; 702/66; 702/84; 702/111
(58) Field of Classification Search ............... 702/57, 702/66, 67, 70, 71, 74, 84, 111, 77, 11; 360/77.12
See application file for complete search history.

(56) References Cited

U.S. PATENT DOCUMENTS

| | | | | | |
|---|---|---|---|---|---|
| 4,251,815 | A | * | 2/1981 | Dagostino | 345/440.1 |
| 5,163,013 | A | * | 11/1992 | Herzer et al. | 702/171 |
| 5,349,962 | A | * | 9/1994 | Lockard et al. | 600/545 |
| 5,539,355 | A | * | 7/1996 | Nakamura | 329/302 |
| 6,201,527 | B1 | | 3/2001 | Dobyns | |
| 6,426,846 | B1 | * | 7/2002 | Chliwnyj et al. | 360/77.12 |

* cited by examiner

*Primary Examiner* — Phuong Huynh
(74) *Attorney, Agent, or Firm* — Gordon Kessler

(57) ABSTRACT

A time domain measurement method and apparatus are provided. The method comprises the steps of acquiring a burst signal and determining a plurality of min/max values of the burst signal. The determined min values are connected to generate a lower floor outline. The determined max values are connected to generate an upper roof outline. The burst signal is displayed along with the lower and upper outlines.

10 Claims, 7 Drawing Sheets

ENVELOPE GENERATION ALGORITHM

BACKGROUND OF THE INVENTION

The present invention relates generally to signal acquisition and display apparatuses, such as an oscilloscope, and more particularly to a method and apparatus for providing a data envelope for an acquired signal.

Signal acquisition and display apparatuses, such as oscilloscopes, are well known devices that receive an input signal, and sample and display the signal in the time domain. Often, it is desirable to define an envelope, or highest and lowest amplitudes, for all time values of a signal. This envelope can then be used for various calculations, and to interpolate amplitudes for time values in which no sample of the original signal was actually taken.

Traditionally, generation of these envelopes have involved the acquisition of multiple waveforms, and the determination of min/max amplitudes for each sampled time value of the multiple waveforms. These min/max values are generated over a large number of signal acquisitions. Such a system is set forth in U.S. Pat. No. 6,201,527 issued to Dobyns. In this patent, a signal is acquired, and min/max data pairs are stored for each of a plurality of sequential samples. An envelope function is generated utilizing min/max pairs from a predetermined number of signal samples. Thus, as is shown in FIG. 3 thereof, the envelope is related not only to the most recently acquired signal sample, but a past number of signal samples.

Inherent in the '527 patent is that the acquired signal samples be somewhat consistent so that the generated envelope is indicative of overall structure and amplitude of the acquired signal. However, a signal sample including an error, or some other anomaly would generate an envelope that was at first indicative of the min/max values generated by the anomaly. Thereafter, the min/max values from the anomaly would move beyond the predetermined number of samples used to generate the envelope, and information about the anomaly would be lost.

Therefore, it would be beneficial to provide an improved method and apparatus that cured the defects of the prior art.

SUMMARY OF THE INVENTION

In accordance with the invention, a method and apparatus are provided for generating a signal envelope based upon a single burst signal, rather than requiring multiple acquisitions. This improvement generates a burst envelope that provides important information to the user of an oscilloscope.

In accordance with the invention, a single burst, or other signal information is acquired by the oscilloscope, and preferably displayed to the user on a display. The user then determines whether an upper roof outline, lower, floor outline, or full envelope outline is desired. The burst data is then used to determine local min/max values in the signal. All of the max values are linearly (or interpretatively) connected to generate the upper roof outline, while the min values are connected in a similar manner to generate the lower floor outline (or both are used to generate the envelope). The user is thus provided with accurate single acquisition timing information between the defined burst envelope and other events.

The invention therefore provides an improved analysis tool for an oscilloscope observing a non-repetitive signal.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to affect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The invention will now be described, making reference to the accompanying drawings.

Figure 1:
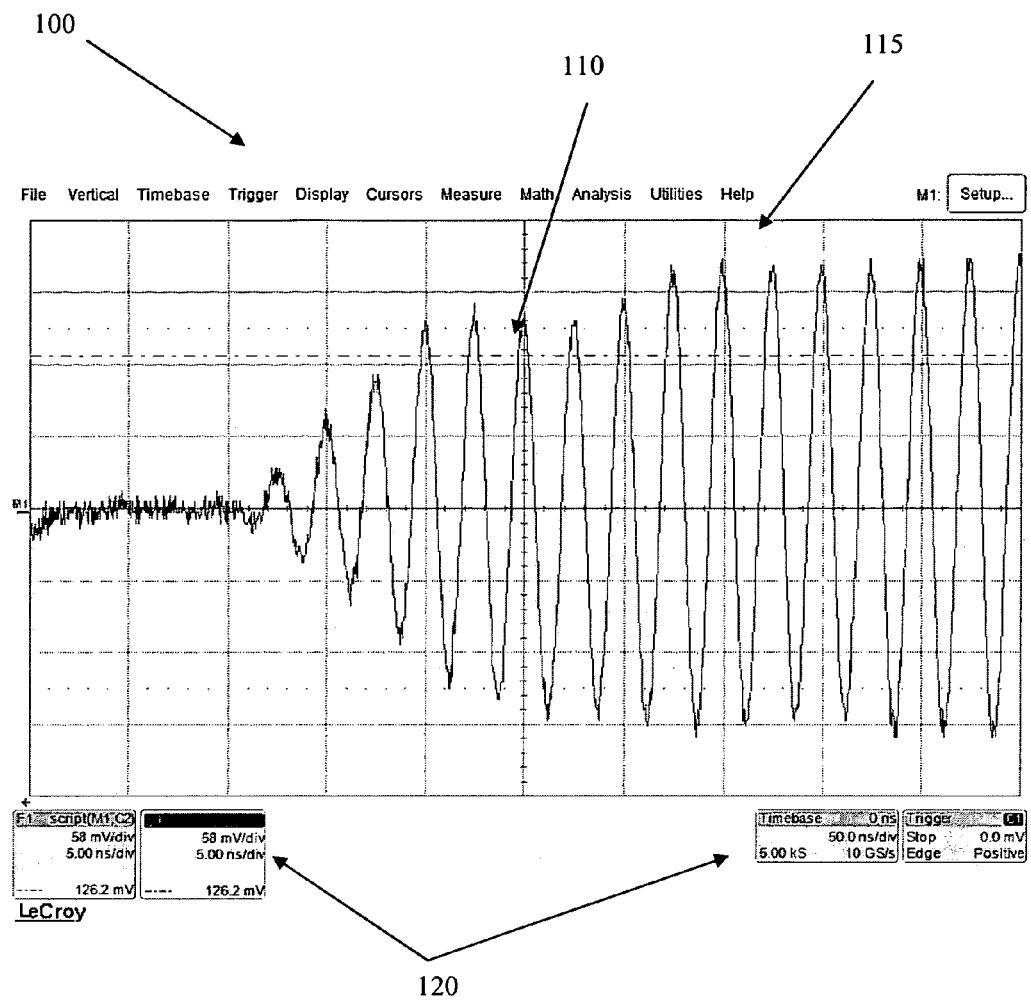
FIG. 1 is a screen image depicting an oscilloscope display of a burst signal before implementation of the invention.

Referring first to FIG. 1, a display 100 is shown presenting an acquired burst signal 110 in a rendering portion 115 of display 100. The burst signal is acquired in accordance with an acquisition system, as is well known in the art. Display 100 further comprises a main portion 120 which includes various information and settings regarding the state of the oscilloscope, and the displayed signal. A menu (not shown) presents various settings that are employed by a user to implement the various features of the current invention, and other features of the oscilloscope.

Figure 5:
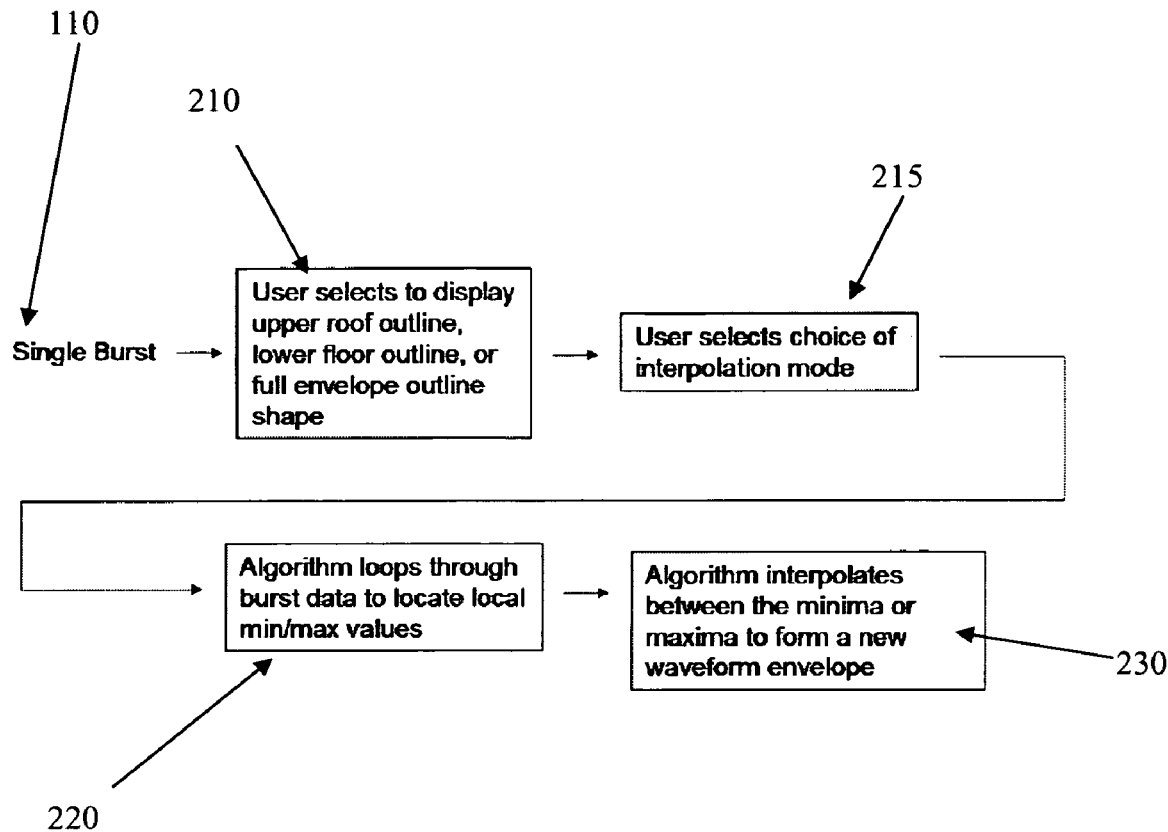
FIG. 5 is a flowchart diagram depicting the steps of the invention.
Figure 6:
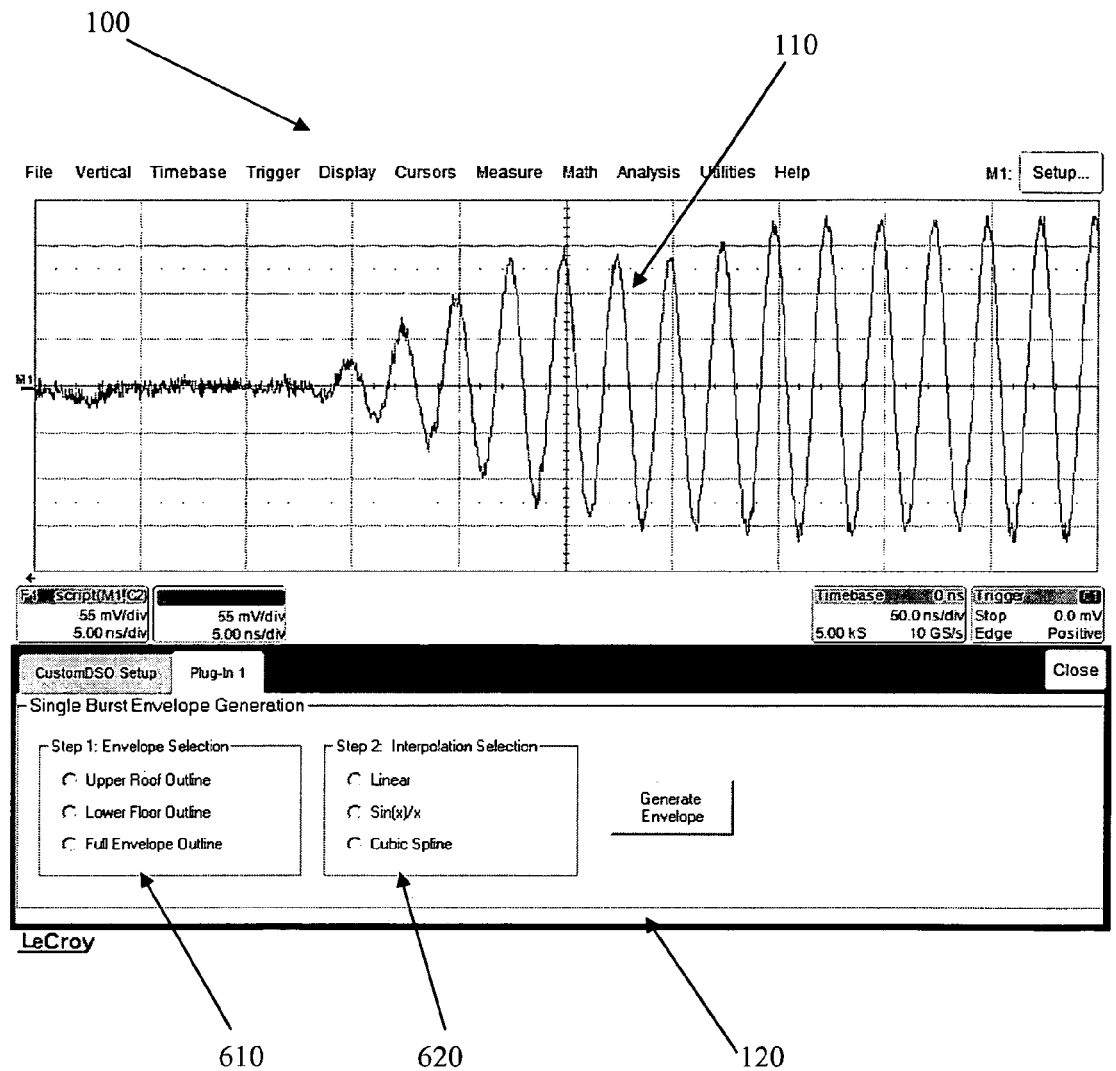
FIG. 6 is a screen image depicting the selection of envelope type and interpolation type.
Figure 7:
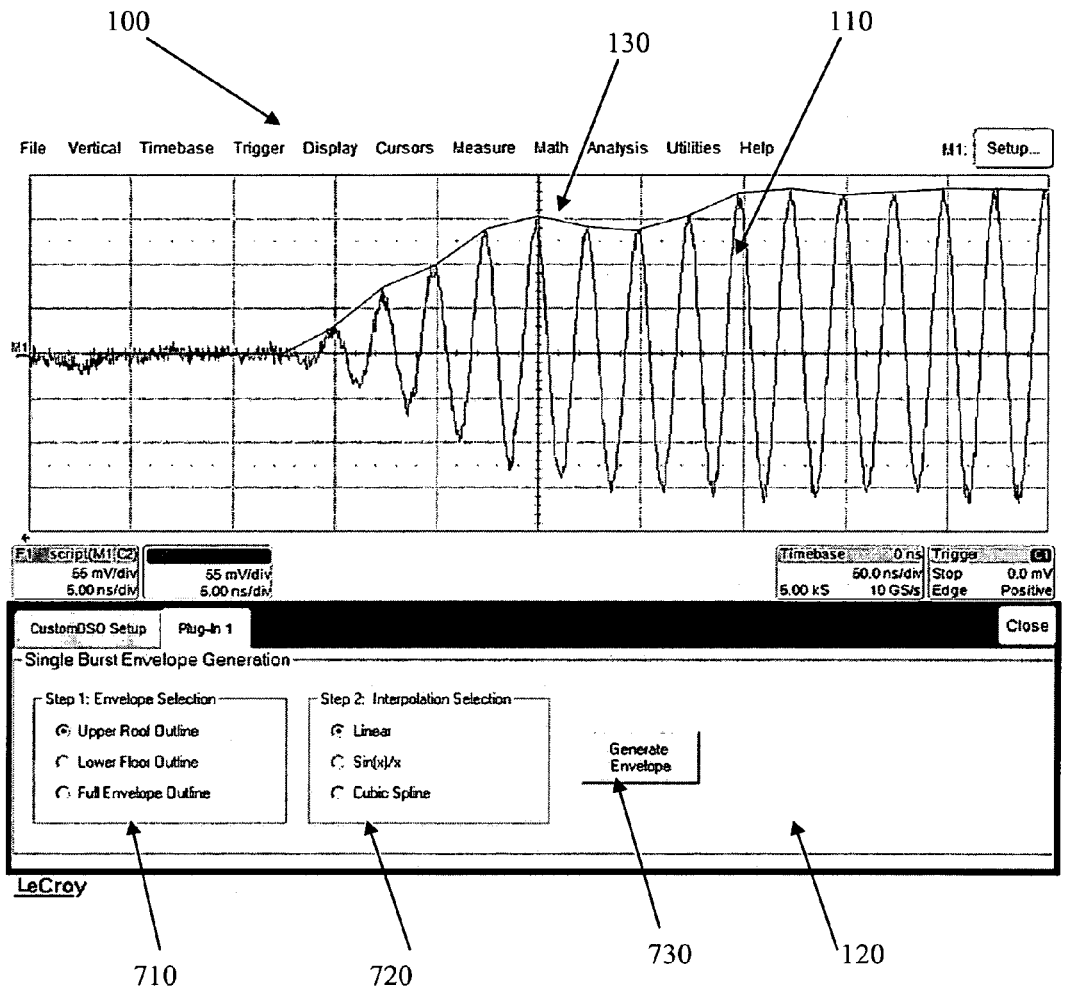
FIG. 7 is a screen image depicting the selected envelope type and interpolation type after selecting "Generate Envelope."

Upon acquisition of such a burst signal 110, the process according to the invention, and as shown in FIG. 5 is performed. Thus, upon capture of burst signal 110, a user selects whether to display a top roof outline, a bottom floor outline, or both in step 210 through the use of a menu portion 610 shown in FIG. 6. Once this selection has been made, control passes to step 215 where the user further indicates a choice of interpolation mode that is to be used in the process. As shown in menu 620 in FIG. 6, these modes may include, for example, linear, Sin(x)/x, cubic spline, or the like. After making desired selections, as shown in menus 710 and 720 of FIG. 7, the user selects the "Generate Envelope" button 730 to begin the processing in accordance with the invention.

Figure 2:
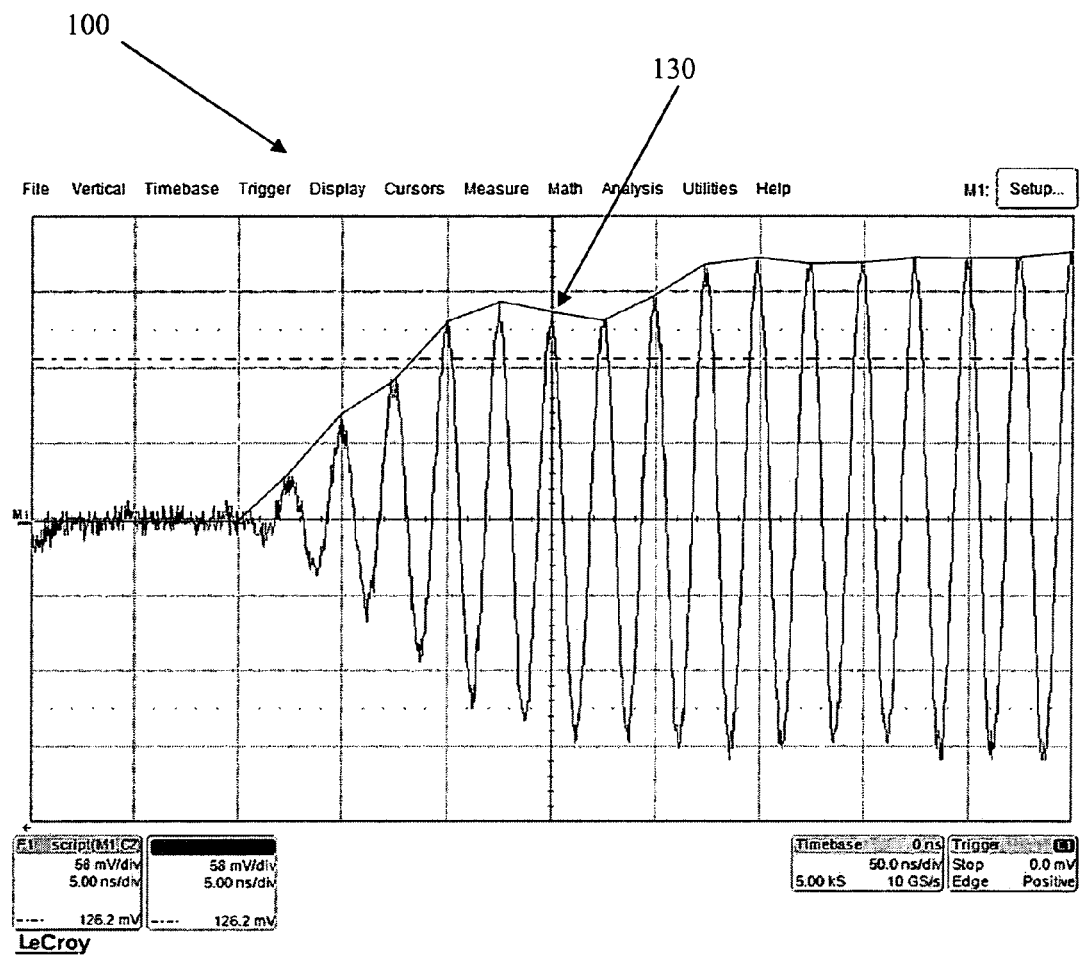
FIG. 2 is a screen image depicting an oscilloscope defining an upper roof outline of the burst signal in accordance with the invention.

After selection, control then passes to step 220 where the local maxima, minima, or both are located from the burst signal. The searching for local minima or maxima is performed by an appropriate controller in accordance with well known techniques. After these local minima and/or maxima are determined, then at step 230, indicated interpolation is performed, and the maxima are connected to each other generating a top roof outline and the minima are connected to each other to generate a lower bottom outline, as appropriate in accordance with the user's prior selection. As noted above, while the connection between adjacent points may be linear, other algorithms for connecting the adjacent points may be employed. An example of such a top roof outline may be displayed on display 100, as is shown at 130 in FIGS. 2 and 7. A similar lower bottom outline may be provided if desired.

Figure 3:
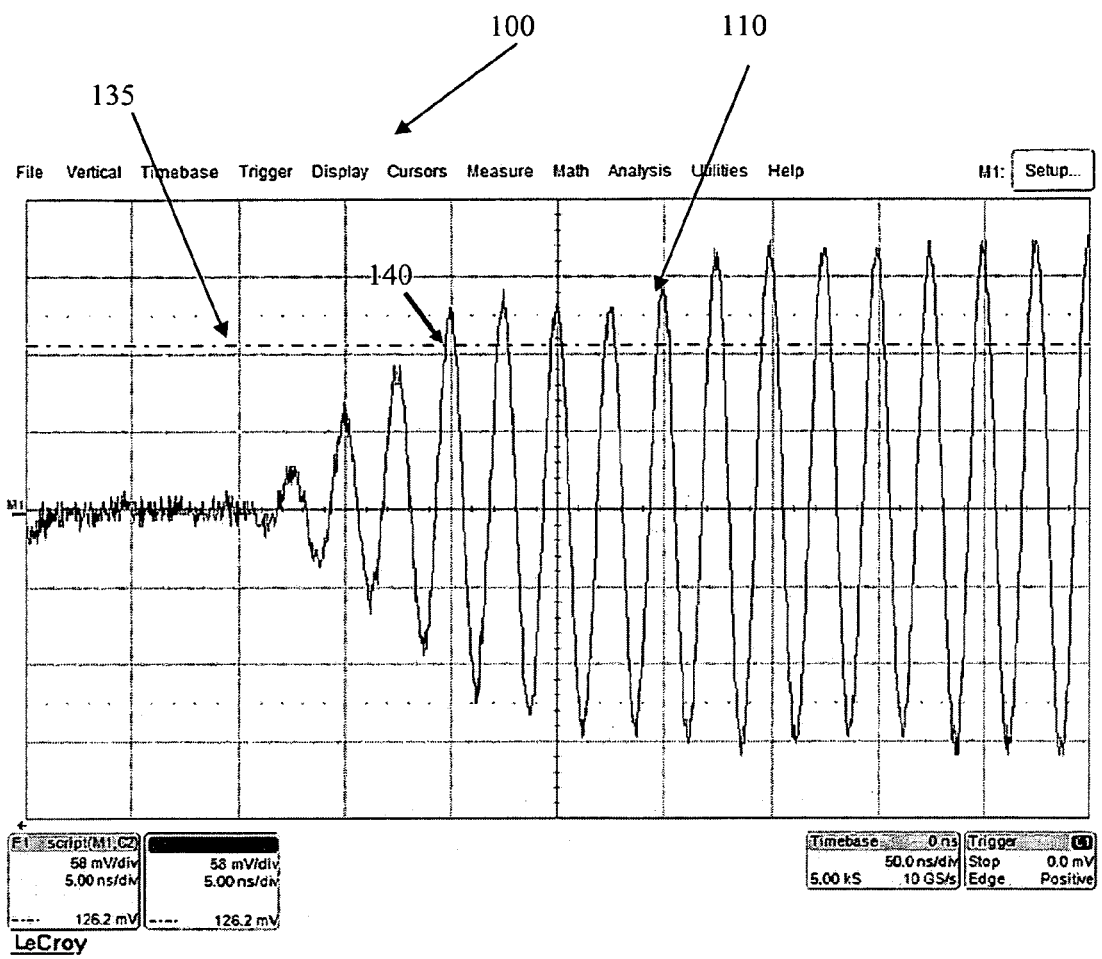
FIG. 3 is a screen image depicting an oscilloscope display pointing out a drawback thereof when the invention is not employed.

Referring next to FIG. 3, an amplitude level 135 is shown. This amplitude value may be designated by a user, and may be used to perform some action when it is determined that the value of the burst signal has reached the predefined amplitude level. As is shown in FIG. 3, the burst signal first reaches the predefined amplitude level 135 at a location consistent with arrow 140. However, as is clear, the precise time the signal crosses the predetermined amplitude threshold is dependent not only upon the overall amplitude of the signal, but the phase and timing of the burst signal. Therefore, if multiple bursts are acquired, there is no guarantee that the signal will first cross the threshold at the same time, and therefore an automatic measurement (or other process to be performed upon the signal reaching the threshold) cannot be taken at a consistent time.

Figure 4:
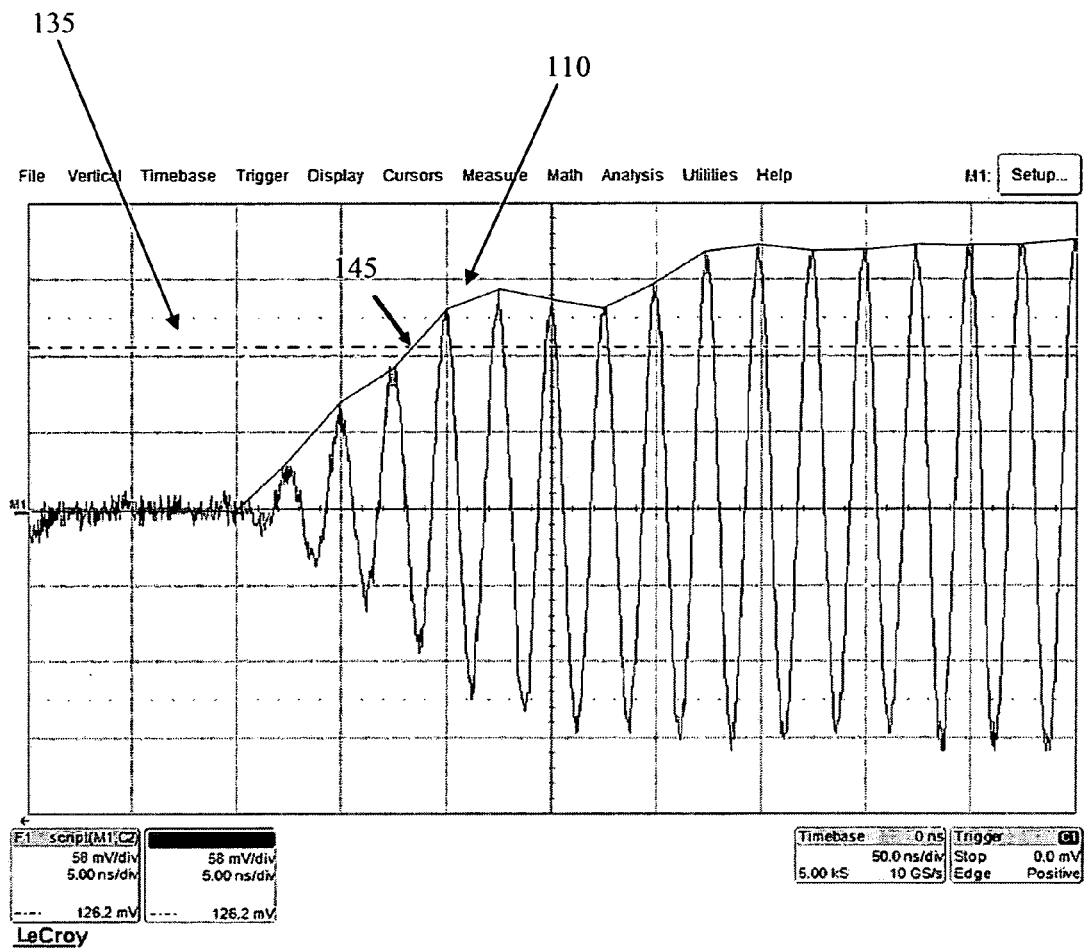
FIG. 4 is a screen image depicting an oscilloscope display pointing out how employment of the invention cures the drawback of FIG. 3.

FIG. 4 shows a similar threshold measurement performed, but based upon top roof outline 130. As is shown, outline 130 crosses threshold 135 at timing consistent with arrow 145, earlier than the timing in FIG. 3. Importantly, for each similar burst, the outline looks similar, and therefore the timing for threshold crossing is consistent. The crossing is no longer dependent on the phase of the burst signal. Automatic measurements or the like can be performed with a consistent and predictable timing.

Therefore, in accordance with the invention, a user is provided with a method and apparatus for generating an envelope for a single burst signal, resulting in a more consistent displayed amplitude level for the signal, and in turn more consistent timing of the signal. Envelope generation from a plurality of signals does not run into this particular issue because if the phase of the signals used to generate the envelope are randomly offset, maxima and minima will be determined at a large number of x axis timing values. The use of a single burst signal can result in inconsistency in amplitude threshold crossings, and in turn benefits to the greatest extent from implementation of the present invention. However, the application of this invention is not so limited, and may be applied to any desired waveform.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall there between.

What is claimed is:

1. A time domain measurement instrument, comprising:
    an acquisition system for acquiring a burst signal;
    an input for receiving an indication of a desired interpolation mode;
    a controller for determining a plurality of min/max values of the acquired burst signal, for connecting the determined min values in accordance with the a preselected interpolation mode to generate a lower floor outline, and for connecting the determined max values to generate an upper roof outline, all values of the acquired burst signal being contained within the lower floor outline and the upper roof outline;
    a display for displaying the acquired burst signal and the lower floor and upper roof outlines; and
    a comparator for comparing at least one of the lower floor or upper roof outlines to a predefined threshold level wherein if it is determined by the comparator that the at least one of the lower floor or upper roof outlines is equal to the predetermined threshold level, a predetermined action is performed.

2. The measurement instrument of claim 1, wherein all of the determined min/max values are min values.

3. The measurement instrument of claim 1, wherein all of the determined min/max values are max values.

4. The measurement instrument of claim 1, wherein the predetermined action is taking a predefined measurement.

5. A time domain measurement method, comprising the steps of:
    acquiring a burst signal;
    receiving an indication of a desired interpolation mode;
    determining a plurality of local maximum values of the acquired burst signal;
    connecting the determined local maximum values in accordance with the indicated desired interpolation mode to generate an upper roof outline, all values of the acquired burst signal being contained below the upper roof outline;
    displaying the acquired burst signal and the upper roof outline; and
    comparing the upper roof outline to a predefined threshold level wherein if it is determined that the upper outline is equal to the predetermined threshold level, a predetermined action is performed.

6. The method of claim 5, wherein the predetermined action is taking a predefined measurement.

7. A non-transitory computer readable medium containing computer instructions stored therein for causing a computer processor within a time domain measurement instrument to perform a set of instructions, the computer instructions comprising instructions for:
    acquiring a burst signal;
    receiving an indication of a desired interpolation mode;
    determining a plurality of local minimum values of the acquired burst signal;
    connecting the determined local minimum values in accordance with the indicated desired interpolation mode to generate a lower floor outline, all values of the acquired burst signal being contained above the lower floor outline;
    displaying the acquired burst signal and the lower floor outline; and
    comparing the lower floor outline to a predefined threshold level wherein if it is determined that the lower outline is equal to the predetermined threshold level, a predetermined action is performed.

8. The non-transitory computer readable medium encoded with the computer instructions of claim 7, wherein the predetermined action is taking a predefined measurement.

9. A time domain measurement instrument, comprising:
    an acquisition system for acquiring a burst signal;
    an input for receiving an indication of a desired interpolation mode;
    a controller for determining a plurality of local maximum values of the acquired burst signal;
    a controller for interpolating between the determined local maximum values in accordance with the desired interpolation mode to generate an upper roof outline, all values of the acquired burst signal being contained below the upper roof outline;

a display for displaying the acquired burst signal and the upper roof outline; and a comparator for comparing the upper roof outline to a predefined threshold level wherein if it is determined that the upper roof outline is equal to the predetermined threshold level, a predetermined action is performed.

10. The instrument of claim 9, wherein the predetermined action is taking a predefined measurement.

* * * * *